United States Patent
Yamazoe et al.

(10) Patent No.: US 7,573,563 B2
(45) Date of Patent: Aug. 11, 2009

(54) EXPOSURE APPARATUS AND DEVICE MANUFACTURING METHOD

(75) Inventors: Kenji Yamazoe, Utsunomiya (JP); Seiji Takeuchi, Utsunomiya (JP); Akiyoshi Suzuki, Tokyo (JP)

(73) Assignee: Canon Kabushiki Kaisha (JP)

( * ) Notice: Subject to any disclaimer, the term of this patent is extended or adjusted under 35 U.S.C. 154(b) by 423 days.

(21) Appl. No.: 11/366,356

(22) Filed: Mar. 1, 2006

(65) Prior Publication Data

US 2006/0210911 A1 Sep. 21, 2006

(30) Foreign Application Priority Data

Mar. 2, 2005 (JP) .............................. 2005-057045
Dec. 8, 2005 (JP) .............................. 2005-355220

(51) Int. Cl.
*G03B 27/72* (2006.01)
*G03B 27/42* (2006.01)
*G03B 27/54* (2006.01)

(52) U.S. Cl. .............................. 355/71; 355/53; 355/67

(58) Field of Classification Search .................. 355/71, 355/53, 67
See application file for complete search history.

(56) References Cited

U.S. PATENT DOCUMENTS

| | | | | |
|---|---|---|---|---|
| 6,078,393 | A * | 6/2000 | Oohashi et al. | 356/511 |
| 6,583,931 | B2 * | 6/2003 | Hiraiwa et al. | 359/497 |
| 6,636,295 | B2 * | 10/2003 | Shiozawa | 355/67 |
| 6,731,383 | B2 * | 5/2004 | Watkins et al. | 356/237.2 |
| 7,084,977 | B2 * | 8/2006 | Nomura | 356/364 |
| 7,248,337 | B2 * | 7/2007 | Teunissen et al. | 355/67 |
| 7,317,512 | B2 * | 1/2008 | De Boeij et al. | 355/71 |
| 7,342,641 | B2 * | 3/2008 | Sogard | 355/55 |
| 7,375,799 | B2 * | 5/2008 | Van De Kerkhof et al. | 355/71 |
| 2001/0052968 | A1 * | 12/2001 | Shiozawa | 355/53 |

(Continued)

FOREIGN PATENT DOCUMENTS

JP 2003-329516 11/2003

OTHER PUBLICATIONS

Michael Bass—Ed.; Handbook of Optics: Devices, Measurements, and properties; vol. 2; McGraw-Hill Professional; II Edition; Sep. 1, 1994; p. 22.19-22.21.*

(Continued)

*Primary Examiner*—Hung Henry Nguyen
*Assistant Examiner*—Bao-Luan Le
(74) *Attorney, Agent, or Firm*—Rossi, Kimms & McDowell LLP

(57) ABSTRACT

An exposure apparatus includes an illumination optical system for illuminating the reticle using the ultraviolet light from the light source, and a polarization measuring unit measuring the polarization state of the ultraviolet light, the polarization measuring unit including an optical unit for providing at least three different phase differences to the ultraviolet light that has passed at least part of the illumination optical system, a polarization element for providing a different transmittance in accordance with a polarization state of the ultraviolet light that has passed the optical unit, and an image pickup device for detecting a light intensity of the ultraviolet light that has passed the polarization element, the polarization measuring unit measuring the polarization state of the ultraviolet light that has passed the at least part of the illumination optical system based on a detection result of the image pickup device.

5 Claims, 12 Drawing Sheets

U.S. PATENT DOCUMENTS

| | | | |
|---|---|---|---|
| 2002/0024673 A1* | 2/2002 | Ouchi | 356/495 |
| 2002/0097386 A1* | 7/2002 | Mishima | 355/67 |
| 2004/0027670 A1* | 2/2004 | Hasman et al. | 359/566 |
| 2004/0114150 A1* | 6/2004 | Wegmann et al. | 356/491 |
| 2004/0262500 A1* | 12/2004 | Mengel | 250/225 |
| 2005/0146704 A1* | 7/2005 | Gruner et al. | 355/71 |
| 2006/0077373 A1* | 4/2006 | Mulkens et al. | 355/71 |
| 2006/0192937 A1* | 8/2006 | Kerkhof et al. | 355/71 |

OTHER PUBLICATIONS

Eugene Hecht; Optics, Addison Wesley; IV Edition; Aug. 12, 2001; p. 329, 348-350, 365.*

M. H. Freeman; Optics; 10th Edition; Butterworth Heinemann; 1990; p. 384.*

Smith et al, "Benefiting from polarization—effects on high—NA imaging", Proceedings of SPIE vol. 5377, pp. 68-79, 2004.

* cited by examiner

|  | FIRST ROTATING ANGLE | SECOND ROTATING ANGLE | THIRD ROTATING ANGLE |
| --- | --- | --- | --- |
| FIRST ROTATING METHOD | $\alpha 1$ | $\alpha 2$ | $\alpha 3$ |
| SECOND ROTATING METHOD | 0 | $\alpha 1$ | $\alpha 2$ |
| THIRD ROTATING METHOD | 0 | $\alpha 1$ | $\alpha 1 + 90$ |
| FOURTH ROTATING METHOD | 0 | $\alpha 1$ | $-\alpha 1$ |

FIG. 6

EXPOSURE APPARATUS AND DEVICE MANUFACTURING METHOD

BACKGROUND OF THE INVENTION

The present invention relates generally to an exposure apparatus, and more particularly to a measurement of a polarization state of exposure light for the exposure apparatus that exposes a plate, such as a single crystal substrate for a semiconductor wafer, and a glass plate for a liquid crystal display.

A conventional projection exposure apparatus uses a projection optical system to project and transfer a circuit pattern of a reticle or a mask onto a wafer, etc., in manufacturing a semiconductor device in the photolithography technology.

Along with recent demands for fine processing to the semiconductor device, a high-resolution exposure apparatus is developed and exposes a pattern having a size of half of an exposure wavelength or smaller. In general, the high resolution is achieved by use of a shorter wavelength of the exposure light and an increase of a numerical aperture ("NA") of a projection optical system. The increase of the NA of the projection optical system, which is referred to as high NA imaging, means an increase of an angle between a perpendicular to the image plane, and a traveling direction of the incident light.

The high NA imaging has a problem of a polarization of the exposure light. For example, assume exposure of a so-called line and space (L&S) pattern that has repetitive lines and spaces. The L&S pattern is formed by the plane-wave two-beam interference. Where an incident plane is defined as a plane including two beams' incident vectors, an s-polarized light is a polarized light perpendicular to the incident plane, and a p-polarized light is a polarized light parallel to the incident plane. A polarized light simply perpendicular to a paper plane may be referred to as the s-polarized light, and a polarized light simply parallel to the paper plane may be referred to as the p-polarized light.

When an angle is 90° between the two beams' incident vectors, the two s-polarized lights interfere with each other, forming a light intensity distribution corresponding to the L&S pattern on the image plane. On the other hand, the two p-polarized lights neither interfere with and cancel with each other, nor form the light intensity distribution corresponding to the L&S pattern on the image plane. The light intensity distribution with a blend of the s-polarized light and p-polarized light has a lower contrast on the image plane than that with only the s-polarized light. As the p-polarized light's ratio increases, the contrast of the light intensity distribution lowers on the image plane, and the pattern is not formed at last.

Polarization control over the exposure light is thus necessary, and fundamental researchs etc. are conducted. See, for example, Proceedings of SPIE, Vol. 5377 (2004), p. 68. An illumination optical system, more specifically, a pupil in the illumination optical system controls a polarization state of the exposure light. The exposure light, which has been polarization-controlled by the pupil in the illumination optical system, is irradiated onto a reticle via an optical system subsequent to the pupil in the illumination optical system, and projected and imaged by the projection optical system onto an image plane. The polarization-controlled exposure light forms a light intensity distribution having a sufficient contrast on the image plane, and realizes a fine pattern resolution.

Nevertheless, even when the pupil in the illumination optical system controls the polarization of the exposure light, the polarization state controlled at the pupil in the illumination optical system is not always maintained up to the image plane due to the influences of the optical system subsequent to the pupil in the illumination optical system and/or the projection optical system. Thus, developments of the illumination optical system and/or the projection optical system that work more ideally are promoted, improving characteristics of the illumination optical system and/or the projection optical system.

For all that, a polarization characteristic is highly likely to vary on assembly into the exposure apparatus due to the stress birefringence. It is thus necessary to measure a polarization state of the exposure apparatus. For example, a proposed measuring apparatus measures the polarization state of the exposure apparatus by calculating a Stokes parameter. See, for example, Japanese Patent Application, Publication No. 2003-329516.

In order to measure or restore the polarization state from the Stokes parameter, the measuring apparatus disclosed in this reference splits the exposure light into plural rays while maintaining the polarization state, and detects the plural split exposure lights, thus requiring light splitting means for splitting the exposure light into plural rays, and plural detectors, such as a CCD, for detecting the plural split exposure lights. When the measuring apparatus is installed in the exposure apparatus, the structure becomes very complex and the exposure apparatus needs a large installation space. Of course, it is sometimes difficult or impossible for an exposure apparatus design convenience to secure the space for the measuring apparatus. It is thus difficult to actually install the above measuring apparatus in the exposure apparatus, and there is a demand for a newly developed measuring apparatus that measures a polarization state of the exposure apparatus.

BRIEF SUMMARY OF THE INVENTION

The present invention is directed to a measuring apparatus and an exposure apparatus having the same, which can accurately measure a polarization state of the light with a simple structure.

An exposure apparatus according to one aspect of the present invention for exposing a pattern of a reticle onto a plate using light from a light source includes an illumination optical system for illuminating the reticle using the light from the light source, and a polarization measuring unit measuring the polarization state of the light, the polarization measuring unit including an optical unit for providing at least three different phase differences to the light that has passed at least part of the illumination optical system, a polarization element for providing a different transmittance in accordance with a polarization state of the light that has passed the optical unit, and an image pickup device for detecting a light intensity of the light that has passed the polarization element, the polarization measuring unit measuring the polarization state of the light that has passed the at least part of the illumination optical system based on a detection result of the image pickup device.

An exposure apparatus according to another aspect of the present invention for exposing a pattern of a reticle onto a plate using light from a light source includes an illumination optical system for illuminating the reticle using the light from the light source, and a polarization measuring unit for measuring a polarization state of the light that has passed at least part of the illumination optical system, wherein the polarization measuring unit includes an optical unit for providing a phase difference to the light that has passed at least part of the illumination optical system, a polarization element for providing a different transmittance in accordance with a polarization state of the light that has passed the optical unit, and an image pickup device for detecting a light intensity of the light that has passed the polarization element.

An exposure method according to still another aspect of the present invention that uses an illumination optical system for illuminating a reticle using light from a light source, to expose a pattern of the reticle onto a plate includes the steps of controlling a polarization state of the light on a pupil plane in the illumination optical system, providing three or more different phase differences to the light at a position closer to the plate than the pupil plane, obtaining a light intensity that is provided with the three or more different phase differences, restoring a polarization state of the light based on the light intensity obtained by said obtaining step, and adjusting the polarization state of the light based on the polarization state of the light restored by said restoring step.

A device manufacturing method according to another aspect of the present invention includes the steps of exposing a plate using the above exposure apparatus, and developing the plate that has been exposed.

The above measuring apparatus also constitutes one aspect of the present invention.

Other objects and further features of the present invention will become readily apparent from the following description of the preferred embodiments with reference to the accompanying drawings.

BRIEF DESCRIPTION OF THE DRAWINGS

FIG. 6 is a view for explaining a method for rotating the phase shifter shown in FIG. 3.

DETAILED DESCRIPTION OF THE PREFERRED EMBODIMENTS

Figure 1:
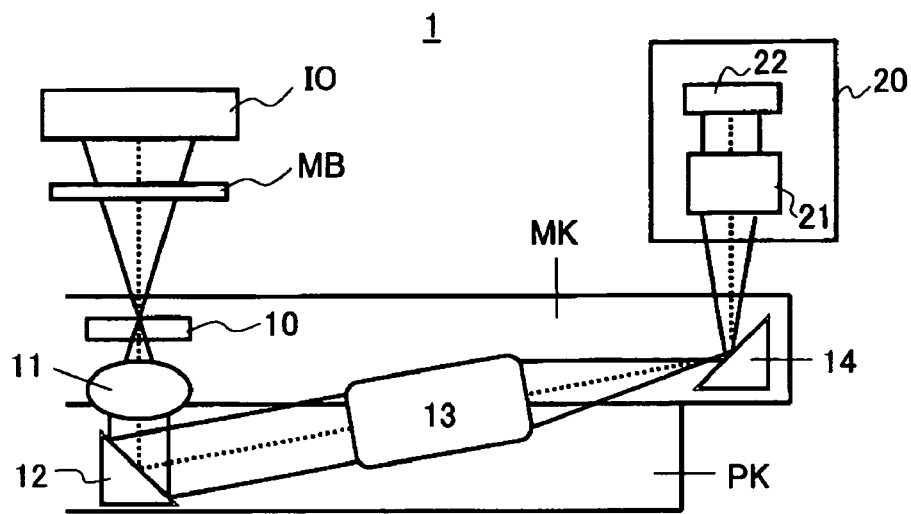
FIG. 1 is a schematic sectional view of a measuring apparatus (polarization measuring unit) according to one aspect of the present invention.

Referring now to the accompanying drawings, a description will be given of preferred embodiments of the present invention. In each figure, similar elements are designated by similar reference numerals, and a detailed description thereof will be omitted.

This inventor addresses that a polarization measurement is equivalent to measurements of amplitudes Ex and Ey and a phase difference δ between the amplitudes Ex and Ey, where x and y are orthogonal coordinate axes, and Ex and Ey are polarized light components along each axis of the amplitude of the incident light.

FIG. 1 is a schematic sectional view of a structure of a measuring apparatus (polarization measuring unit) 1 according to one aspect of the present invention. The measuring apparatus 1 introduces illumination light to image taking means 20 having an image pickup device 22 via a pinhole 10 and a Fourier transformation optical system 13. In FIG. 1, IO denotes an illumination optical system in the exposure apparatus. MB denotes a masking blade. A thin film pellicle PK that protects a pattern surface from dust is generally attached to a mask MK in the exposure apparatus. The measuring apparatus 1 should be as large as the mask MK and the pellicle PK, and can be installed in the exposure apparatus. Of course, the measuring apparatus 1 may be installed onto a mask stage or mask driving mechanism even when there is no pellicle PK, or installed in the exposure apparatus independent of the mask stage. Preferably, the measuring apparatus 1, in particular the pinhole 10, is made movable on a plane perpendicular to the optical axis of the illumination and/or projection optical systems. Of course, a member that has many pinholes and light shielding members that shield the pinholes are provided and the light shielding members may be driven so that the pinhole can be apparently moved.

The illumination light from a light source (not shown) is introduced to the illumination optical system IO, and incident with a desired light intensity distribution upon the mask plane. More specifically, the illumination light introduced by the illumination optical system IO is narrowed by the masking blade MB that restricts the illumination area on the mask plane, and incident upon the pinhole 10.

The pinhole 10 may be defocused slightly from the mask plane for space convenience. The illumination light that has passed the pinhole 10 is turned into an approximately parallel light by a collimator lens 11. The parallel illumination light is incident upon the Fourier transformation optical system 13 via a deflector 12, such as a mirror and a prism.

The Fourier transformation optical system 13 forms an aerial pupil image at a position corresponding to an image taking plane of the image taking means 20. The aerial image is incident upon the image taking means 20 via a deflector 14. The aerial image incident upon the image taking means 20 on the image pickup device 22 that is approximately conjugate with the image taking plane. While this embodiment provides the image taking means 20 to the exposure apparatus, it may be provided to the measuring apparatus 1. More specifically, this embodiment allows the image taking means 20 to serve as aberration measuring means, for example, of a wavefront aberration of the projection optical system, and alignment measuring means between the mask and the plate, such as a wafer and another substrate. Of course, the image taking means 20 may be supported separately from the exposure apparatus.

Figure 2:
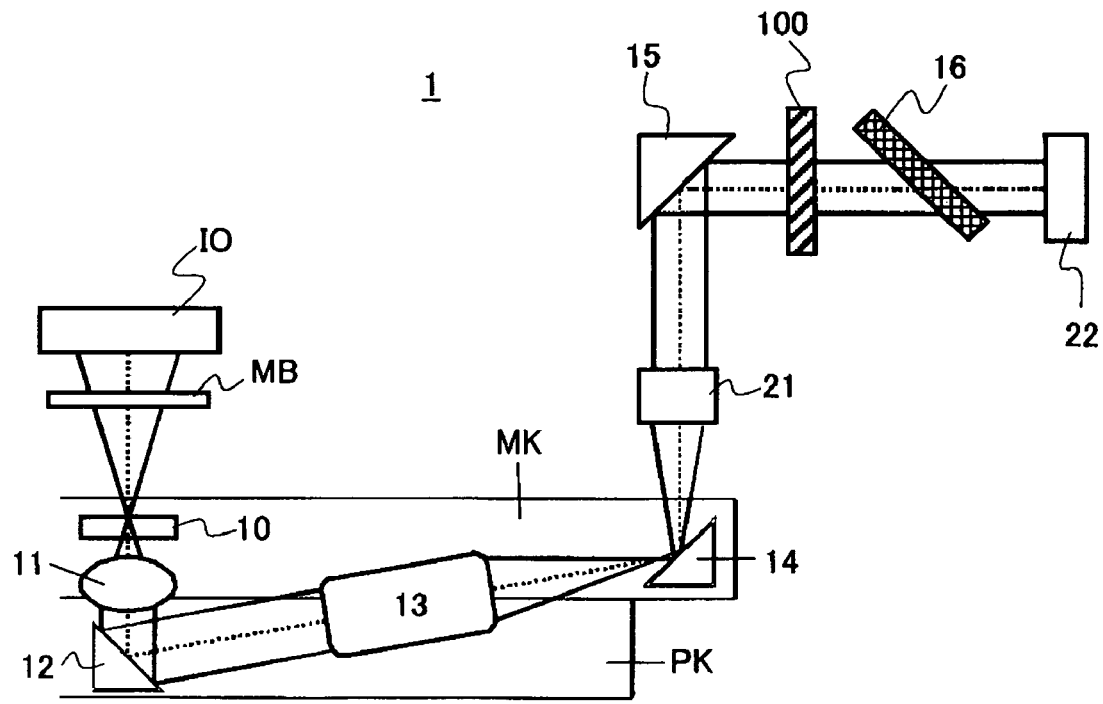
FIG. 2 is a schematic sectional view of a measuring apparatus (polarization measuring unit) according to one aspect of the present invention.

The measuring apparatus 1 arranges, at an illumination-light collimating position, a polarization element and a birefringent member (including a member that exhibits a stress birefringence) for providing a birefringence to the transmitting light. Thereby, the measuring apparatus 1 can measure the polarization state of the illumination light. FIG. 2 shows the measuring apparatus 1 that arranges the birefringent optical unit 100 and the polarization element 16 that transmits the light polarized in a predetermined direction and shields the light polarized in another direction. The polarization element (polarizer) 16 is an element that has different transmittances and light intensity transmittances to two differently polarized lights. A difference of the transmittance (light intensity transmittance) may be 30% or greater, preferably 50% or greater, in view of the measurement accuracy. The birefringent optical unit 100 and the polarization element 16 are arranged in this order form the light source (not shown) side ortho light incident side. FIG. 2 arranges a deflector 15 between the image taking optical system 21 and the birefringent optical system 100.

A description will be given of the polarization measurement using the measuring apparatus 1. For orthogonal x-axis and y-axis, the light intensity measured by the image pickup device 22 is a function of three unknown valiables, i.e., x-direction amplitude Ex, y-direction amplitude Ey, and phase difference δ. Thus, the polarization state of the incident light can be restored or measured when the light intensity is measured at three independent states. The three independent states are created, for example, by generating three or more phase differences at the birefringent optical unit 100 that provides a phase difference to the transmitting light, by varying an optic axis direction of the birefringent optical unit 100 (or by rotating it within a plane perpendicular to the optical axis). A birefringent glass material (uniaxial characteristic) is a glass material that advances the polarized light in the fast axis direction most quickly, and delays the polarized light in the slow axis direction most slowly. This specification refers to as a birefringent amount a difference between the refractive index in the fast axis direction and the refractive index in the slow axis direction, multiplied by a thickness of the glass material, divided by the wavelength of the incident light, and multiplied by 2π (number π: the circular constant). Since the light traveling speed differs between the slow axis direction and the fast axis direction, the incident light creates a phase difference. Given the glass materials having different birefringent amounts, a phase difference given to the incident light is made variable. Alternatively, when the birefringent glass material is rotated on a plane perpendicular to optical axis, the optic axis inclines relative to the x-axis and the y-axis. In a broad sense, a different phase difference is provided to the x-polarized light component and the y-polarized light component in accordance with a rotating angle. This embodiment provides a different phase difference to the incident light by using glass materials having different birefringent amounts, and/or by rotating the birefringent glass material within a plane perpendicular to the optical axis.

No phase difference is, of course, one phase difference, and the three or more phase differences are, for example, no phase difference, a first phase difference, and a second phase difference different from the first phase difference. No phase difference is realized by placing no optical element or a member that has substantially no birefringence at a position of the birefringent optical unit 100. This configuration can thus measure the polarization state of the illumination light for illuminating the mask MK.

Figure 3:
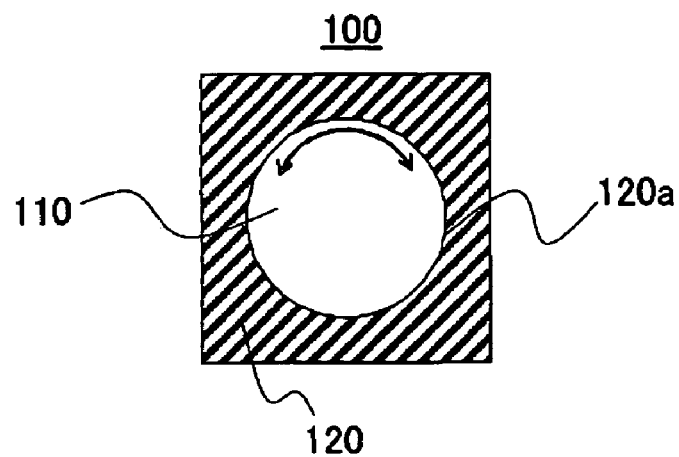
FIG. 3 is a schematic plane view of one illustrative structure of a birefringent member shown in FIG. 2.

The birefringent optical unit 100 includes, for example, as shown in FIG. 3, a phase shifter 110, and a phase shifter holder 120. The phase shifter 110 uses a birefringent glass material. The phase shifter holder 120 has a window 120a having a rotating mechanism that rotates within the plane shown in FIG. 3, and the phase shifter 110 that provides a phase difference or a birefringence is arranged on the window 120a. When the phase shifter 110 is rotated at three or more different angles (which, of course, may include 0°) and the light intensity is measured at three states, the polarization state of the illumination light can be measured or restored. Here, FIG. 3 is a schematic plane view of one exemplary structure of the birefringent optical unit 100.

Figure 4:
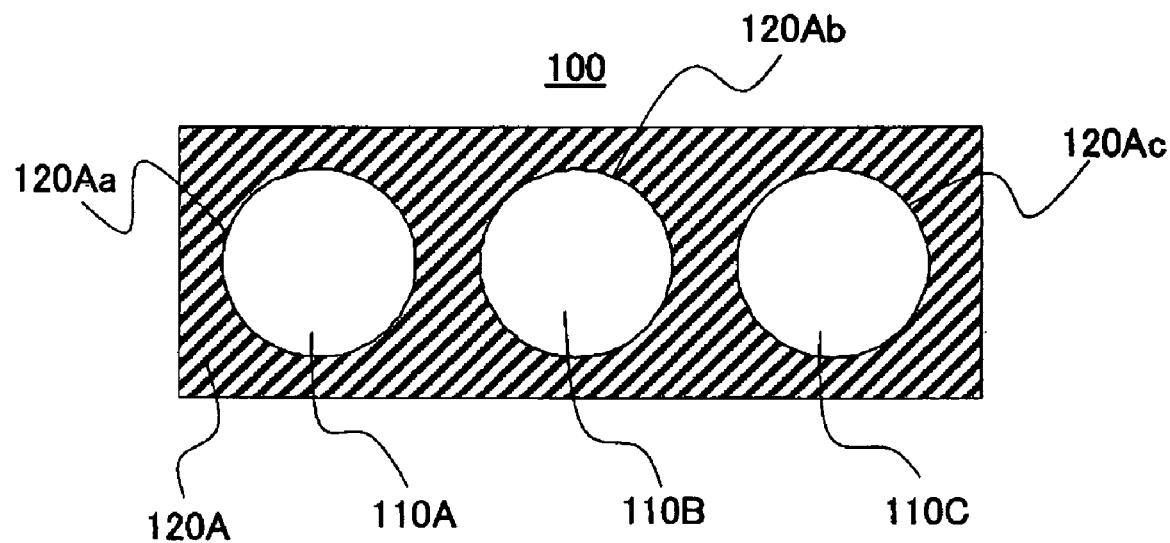
FIG. 4 is a schematic plane view of another illustrative structure of a birefringent member shown in FIG. 2.

As shown in FIG. 4, the birefringent optical unit 100 may use a phase shifter 120A that has three windows 120Aa to 120Ac and arranges phase shifters 110A to 110C having different birefringent amounts at respective windows. The phase shifter 110A to 110C may use a phase shifter having the same birefringent amount and a different fast axis direction, or a phase shifter having a different birefringent amount and a different fast axis direction may be used. When each of the windows 120Aa to 12OAc has the rotating mechanism that rotates within the plane shown in FIG. 4, the degree of freedom improves in comparison with use of the fixed phase shifters 110A to 110C. One window may not provide a phase difference to the transmitting light, and other two windows may provide a phase difference to the transmitting light. The window that does not provide any phase difference may be transparent or made of a glass material having no birefringence. The number of windows of the phase shifter holder 120A is not limited to three, and may be three or more. Here, FIG. 4 is a schematic plane view of another exemplary structure of the birefringent optical unit 100.

In order for the birefringent optical unit 100 shown in FIG. 4 to measure the polarization state, the illumination light is transmitted to the phase shifter 110A and the light intensity is measured. Next, the phase shifter holder 120A is moved or the illumination light is shifted, and the illumination light is transmitted to the phase shifter 110B and the light intensity is measured. Next, the phase shifter holder 120A is moved or the illumination light is shifted, and the illumination light is transmitted to the phase shifter 110C and the light intensity is measured. The polarization state of the illumination light is restored or measured from the thus obtained three light intensities.

Figure 5A:
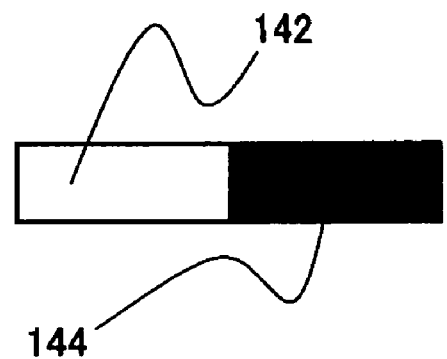
FIGS. 5A and 5B are schematic plane views of still another illustrative structure of a birefringent member shown in FIG. 2.
Figure 5B:
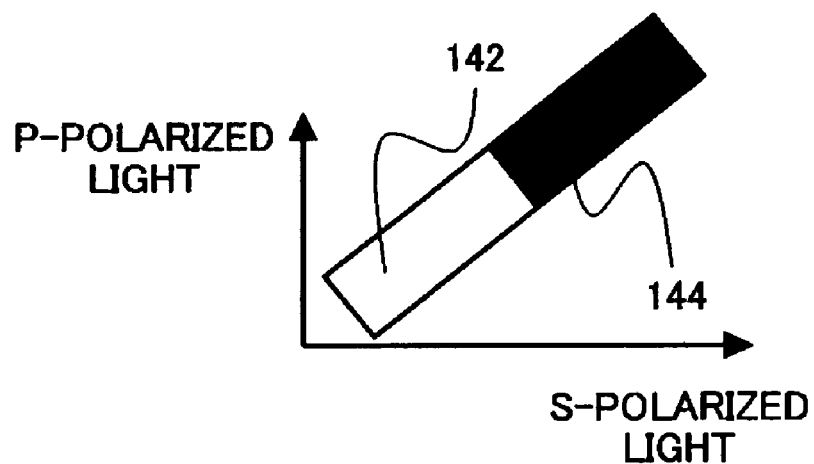

The birefringent optical unit 100A may use a photoelastic modulater (photoelastic modulator, photoelastic member) 140 as shown in FIGS. 5A and 5B. The photoelastic modulater 140 is an element that generates a birefringence when receiving a stress. The photoelastic modulator 140 provides a different birefringence according to an applied stress, and can provide three or more phase differences to the transmitting light. Here, FIGS. 5A and 5B are schematic sectional views of another exemplary structure of the birefringent optical unit 100.

The photoelastic modulater 140 includes, as shown in FIG. 5A, a light transmitting part 142, and a stress applying part 144. The light transmitting part 142 provides a birefringence to the transmitting light when the stress applying part 144 is pressed or pulled in the longitudinal direction. A virtual optic axis is formed along the stress direction. When orthogonal s-polarized and p-polarized axes are defined as shown in FIG. 5B, the photoelastic modulater 140 is inclined so that the virtual optic axis is inclined by a certain (inclination) angle. Of course, the inclination angle of the photoelastic modulator 140 may be made variable. The birefringence occurs along the stress applying direction whether it is a compressive or tensile stress. When the stress is adjusted (to change the birefringence of the photoelastic modulator 140) after the stress applying direction is inclined to the polarization direction of the incident light, the phase difference provided to the incident light can be made variable.

The photoelastic modulator 140 has a problem in that it is difficult to make uniform stress applied to the light transmitting part 142. An uneven stress cannot make uniform phase difference provided to the transmitting light, causing a measurement error. Accordingly, it is preferable to apply a uniform stress to the light transmitting part 142 by resonating the stress applying part 144 that applies the stress to the light transmitting part 142.

Although the measuring apparatus 1 is, in principle, able to measure a polarization state of the exposure apparatus, this inventor has discovered that the measuring accuracy of the measuring apparatus 1 scatters due to the birefringent amount of the birefringent glass material. A description will now be given of measuring-accuracy improving condition of the measuring apparatus 1.

The phase shifter 110 shown in FIG. 3 is made of a birefringent glass material, as described above, and has a fast axis and a slow axis orthogonal to the fast axis. The orthogonal x-axis and y-axis is created on the image pickup device 22. In general, one of the x-axis and y-axis is accorded with the transmitting axis of the polarization element 16, because so doing would enable the phase shifter 110 to provide a relative phase difference $\Phi$ between the x and y components of the incident light amplitude.

The polarization measurement needs to set a reference axis. A measurement operator can set the reference axis. For example, the reference axis may be transmission axis of the polarization element 16 or an ideal polarization direction to be formed. This embodiment sets to a rotating angle of 0° the fast axis of the phase shifter 110 or a state at which the fast axis overlaps the reference axis, when a light source direction (not shown) is viewed from the image pickup device 22. In addition, a positive angle is defined as an angle when the phase shifter 110 in this state is rotated counterclockwise, and a negative angle is defined as an angle when the phase shifter 110 in this state is rotated clockwise.

A rotating angle of the phase shifter 110 is set to a first rotating angle $\alpha 1$, and the image pickup device 22 measures the illumination light intensity as a first intensity. Similarly, a rotating angle of the phase shifter 110 is set to a second rotating angle $\alpha 2$, and the image pickup device 22 measures the illumination light intensity as a second intensity. Finally, a rotating angle of the phase shifter 110 is set to a third rotating angle $\alpha 3$, and the image pickup device 22 measures the illumination light intensity as a third intensity. The polarization state of the illumination light is restored or measured by solving a proper equation based on the first, second and third intensities.

The parameters that involve the accuracy of the polarization measurement is a birefringent amount $\Phi$ of the phase shifter 110, the rotating angles $\alpha 1$ to $\alpha 3$ of the phase shifter 110, and the extinction ratio of the polarization element 16 in such a polarization measurement. This embodiment identifies the birefringent amount $\Phi$ and the rotating angles $\alpha 1$ to $\alpha 3$ suitable for a highly accurate measurement of the polarization state of the illumination light, and as well as a structure that improves an extinction ratio of the polarization element 16. The extinction ratio is a ratio of the transmittance or the dose between the light polarized in a direction to be transmitted, and the light polarized in a direction to be shielded. When the extinction ratio is low, the polarization element cannot properly serve as a polarization element that measures the polarization state. Although a polarization element has a high extinction ratio for the visible light having a wavelength between about 400 nm to 700 nm, few polarization elements have a high extinction ratio for the UV light particularly having a wavelength of 250 nm or smaller (200 nm or smaller) Therefore, a structure that improves the extinction ratio is necessary. A description will also be given of a method of reducing a reduction of the measuring accuracy caused by a shape error of the phase shifter 110.

There are four conceivable methods, i.e., first to fourth methods, of rotating the phase shifter 110 three times (or setting three rotating angles of the phase shifter 110), as shown in FIG. 6. The order of rotations in the following first to fourth rotating methods is not limited. FIG. 6 is a view for explaining a rotating method of the phase shifter 110.

The first rotating method is a general rotating method that uses a first rotating angle $\alpha 1$, a second rotating angle $\alpha 2$, and a third rotating angle $\alpha 3$, and these three rotating angles have no correlations.

The second rotating method uses a first rotating angle of 0° (or no rotation), a second rotating angle of $\alpha 1$, and a third rotating angle $\alpha 2$ (of course, different from $\alpha 1$). The second rotating method is characterized in that these three rotating angles have no correlations but the first rotating angle is 0°.

The third rotating method uses a first rotating angle of 0° (or no rotation), a second rotating angle of $\alpha 1$, and a third rotating angle $\alpha 1+90°$. The third rotating method is characterized in that the second and third angles are correlated with a difference of 90° and the first rotating angle is 0°.

The fourth rotating method uses a first rotating angle of 0° (or no rotation), a second rotating angle of $\alpha 1$, and a third rotating angle $-\alpha 1$. The fourth rotating method is characterized in that the second and third angles are correlated with a different sign and the first rotating angle is 0°.

As a result of studies of the first to fourth methods, it is discovered that the third rotating method is less affected by an error and can provide a highly accurate measurement of the polarization state. This results from an orthogonal arrangement between the fast axis and the slow axis. The phase shifter 110 at the second rotating angle and the phase shifter 110 at the third rotating angle have such a relationship that the fast axis and the slow axis are exchanged with each other. It is therefore possible to consider that a phase difference $\Phi'$ is given at the second rotating angle, and a phase difference $-\Phi'$ is given at the third rotating angle. This symmetry is one cause of an error-resistant characteristic.

Figure 7:
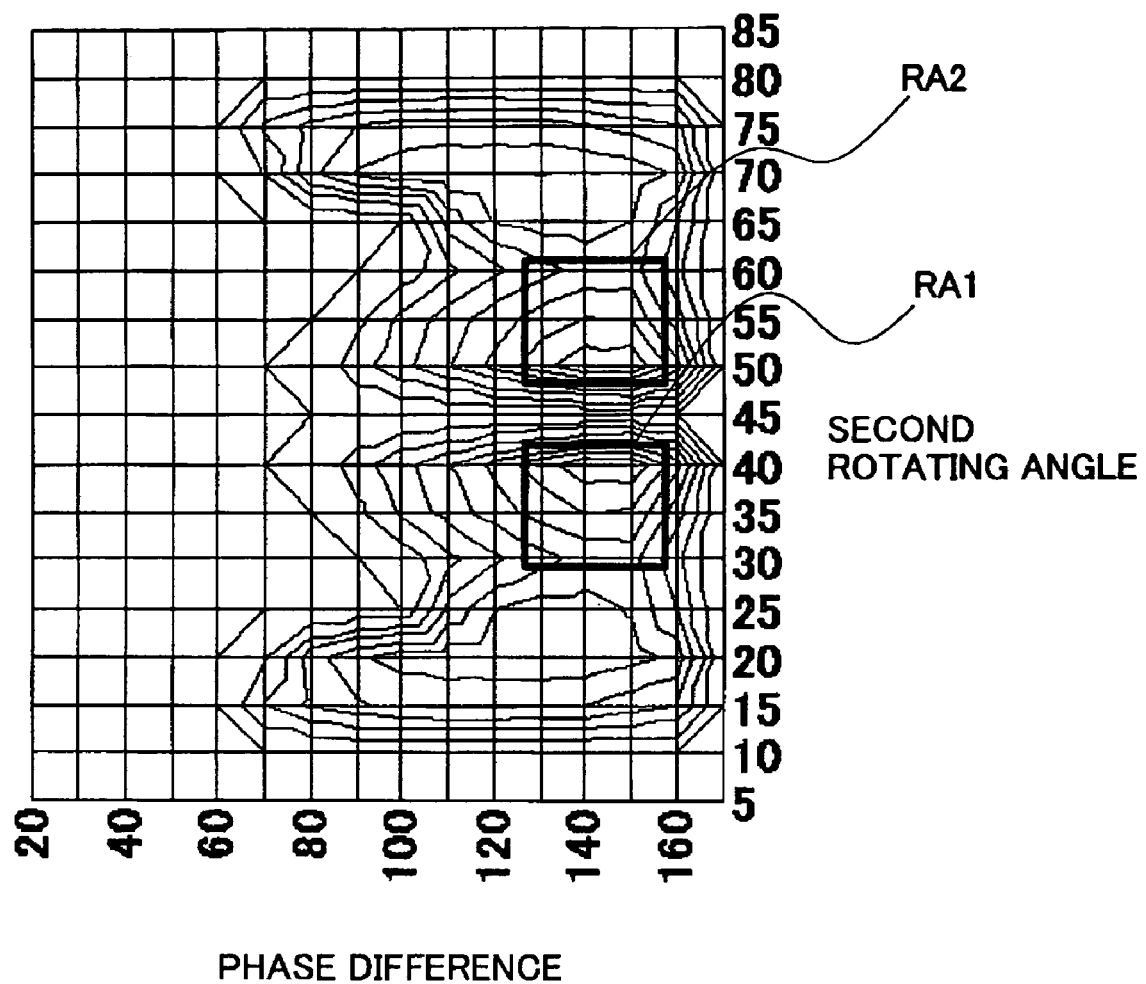
FIG. 7 is a graph showing a relationship between an optimal birefringent amount of the phase shifter and an optimal rotating angle in a third rotating method in FIG. 6.

In the third rotating method, the second rotating angle $\alpha 1$ may be a positive rotating angle and range between 0° and 90° due to the symmetry of the phase shifter 110. In addition, the birefringent amount of the phase shifter 110 may range between 0° and 180°. As a result of the earnest study, this inventor narrowed the suitable second rotating angle $\alpha 1$ and the birefringent amount of the phase shifter 110. FIG. 7 shows the resultant graph of sensitivity to an error, and sets the abscissa axis to the birefringent amount $\Phi$ of the phase shifter 110 and the ordinate axis to the second rotating angle $\alpha 1$. In other words, FIG. 7 is a graph showing a relationship between the suitable birefringent amount of the phase shifter 110 and the suitable rotating angle.

Areas RA1 and RA2 enclosed by a black frame in FIG. 7 are areas insensible to the error. From the symmetry of the phase shifter 110, there are two preferable areas, i.e., the first area RA1 and the second area RA2. The first area RA1 corresponds to the second rotating angle $\alpha 1$ between 27° and 42° (preferably 32° or greater and/or 39° smaller), and the birefringent amount between 125° and 155° (preferably 130° or greater and/or 150° or smaller). The second area RA2 corresponds to the second rotating angle α1 between 48° and 63° (preferably 51° or greater and/or 58° or smaller), and the birefringent amount between 125° and 155° (preferably 130° or greater and/or 150° or smaller). Even when a sign of the rotating angle is inverted between the first area RA1 and the second area RA2, they remain insensible areas to the error. Therefore, the areas having an inverted rotating angle are preferable in this embodiment. Similarly, the preferable area to this embodiment is obtained by inverting a sign of the birefringent amount.

The polarization element 16 is modified to improve the polarization measurement accuracy. The exposure apparatus generally uses a UV light source, and no good polarization elements exist. When the durability and performance are considered, a polarizing beam splitter ("PBS") in which a Brewster window is coated with a multilayer film may serve as a polarization element to the UV light, but provides no sufficient extinction ratio. The Brewster window is a transparent plane-parallel plate in which the incident angle is set to an approximately Brewster angle.

Accordingly, the polarization element 16 uses two or more PBSs or two or more Brewster windows or a combination of the PBS and the Brewster window. The PBS is generally set to an incident angle of 45°, and the extinction ratio improves when the incident angle is set to approximately the Brewster angle.

Processing of the image pickup device 22 is studied in order to improve the polarization measurement accuracy. When the image pickup device 22 has plural pixels, the polarization state at an arbitrary point in the light can be conveniently known. The pixel is a minimum unit that can measure the light intensity.

When the image pickup device 22 uses a CCD by way of example, the ray of the incident light at certain part is incident upon a predetermined pixel in the CCD. When the polarization state is measured by each pixel in the CCD, the polarization state is measured at each point in the incident light. Ideally, the phase shifter 110 is a plane-parallel plate, but may be a wedge or not a perfect plate due to a fabrication error. In addition, the incident light is not perfectly collimated light. Therefore, even when the phase shifter 110 rotates, the light does not always travel in a predetermined direction. For example, assume that the light is narrowed down to a size of one pixel in the CCD, and the light is incident upon a specific pixel (first pixel) on the CCD when the phase shifter 110 is at a first rotating angle. When the phase shifter 110 is at a second rotating angle, the above error shifts the light from the first pixel to another pixel. Therefore, a measurement error occurs when the polarization state is measured at each pixel on the CCD. In order to reduce the measurement error caused by a shift of the light, it is effective to average the light intensities measured by plural pixels instead of measuring the polarization state using only one pixel on the CCD.

This inventor performed various experiments to verify the condition to improve the measurement accuracy of the measuring apparatus 1. A description will now be given of concrete experiments performed by this inventor:

First Embodiment

Figure 8B:
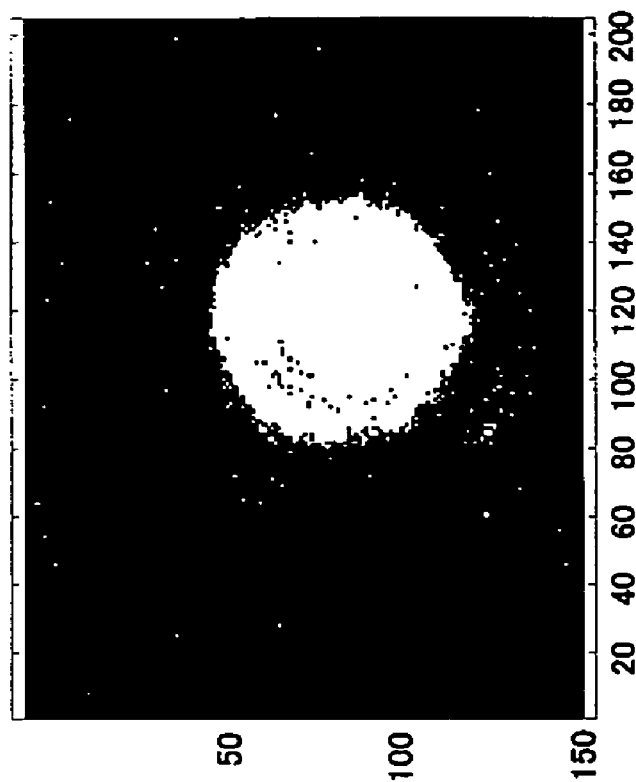
FIGS. 8A and 8B are views that compare the rotating methods of the phase shifter with the polarization measurement's accuracy.
Figure 8A:
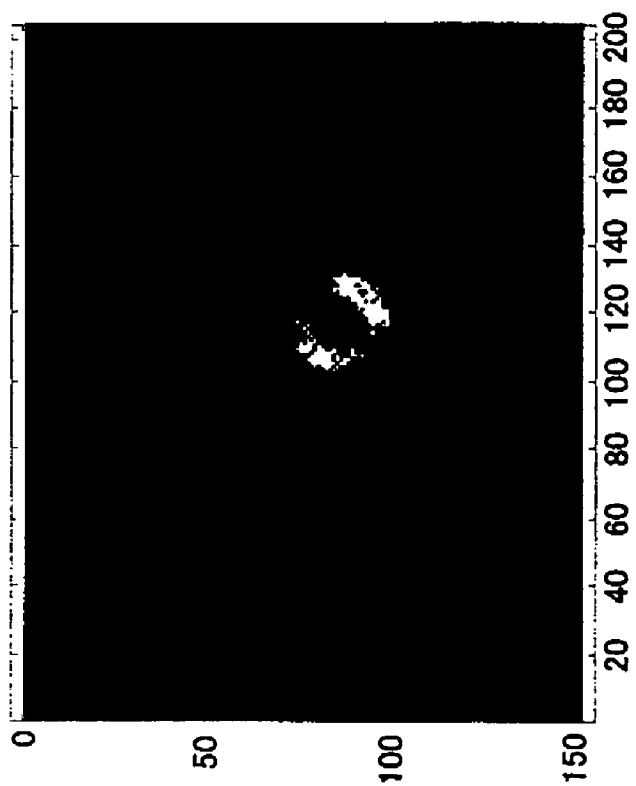

FIG. 8 shows an experimental result that compares the first to fourth rotating methods with each other. These experiments introduce the light that is polarized in the y direction, and measure the polarization state. A measurement of the polarization state can be regarded as a highly precise measurement when the x light intensity to the y light intensity of the measured polarization state is 0.5% or smaller. Here, FIGS. 8A and 8B are views that compare the rotating method of the shifter 110 with the polarization measurement accuracy.

Since the first and second rotating methods rotate the phase shifter 110 with no correlation, it is expected that they are inferior in polarization measurement accuracy to the third or fourth rotating method.

The polarization measurement accuracy by the third rotating method will now be compared with that of the fourth rotating method. A phase difference which the phase difference used for the comparison provides to the transmitting light is about 144°. The third and fourth rotating methods use the same size of the light is used for the experiments.

FIG. 8A shows an experimental result in which the second rotating angle is made at 57° in the fourth rotating method. FIG. 8B shows an experimental result in which the second rotating angle is made at 57° in the third rotating method. In FIGS. 8A and 8B, black part means that the x component intensity is 0.5% or greater to the y component intensity in the measured polarized light, indicating less polarization measurement accuracy. On the other hand, white part means that the x component intensity is smaller than 0.5% to the y component intensity in the measured polarized light, indicating high polarization measurement accuracy. When FIGS. 8A and 8B are compared with each other, the third rotating method has clearly more white parts and thus a higher accuracy than the fourth rotating method.

The expanded principle can explain the optimal stress application when the birefringent optical unit 100 uses the photoelastic modulater 140. As described above, it is possible to consider that the third rotating method provides the phase difference $\Phi'$ at the second rotating angle, and the phase difference $-\Phi'$ at the third rotating angle. The photoelastic modulater 140 is a member that provides a phase difference to the transmitting light when receiving the stress. When the phase difference $\Phi'$ is provided to the transmitting light in response to the stress, the phase difference $-\Phi'$ is, in principle, provided to the transmitting light in response to the reverse stress. Therefore, in measuring the polarization state using the photoelastic modulater 140, the photoelastic modulater 140 is arranged while inclined between 48° to 63°, and the first intensity is obtained with no stress. Next, the second intensity is obtained when the stress that provides the phase difference $\Phi'$ is applied. The third intensity is obtained when the stress that provides the phase difference $-\Phi'$ is applied. The polarization state is restored or measured by solving a proper equation based on the obtained first to third intensities. According to the experiments by this inventor, the polarization is measured at a high accuracy when a difference of the absolute value between the phase difference $\Phi'$ and the phase difference $-\Phi'$ is within 7° or smaller.

Second Embodiment

An experiment different from the first embodiment is performed in order to calculate an optimal value of the birefringent amount Φ of the phase shifter 110 using the third rotating method. This experiment uses a phase shifter A having a birefringent amount of about 87°, when converted into a degree, and a phase shifter B having a birefringent amount of about 144°, when converted into a degree. This experiment introduces the light polarized in the y direction, and measures a polarization state. A highly accurate polarization measurement is defined as a measurement having the x component intensity to the y component intensity in the measured polarized light is 0.5% or smaller.

Figure 9B:
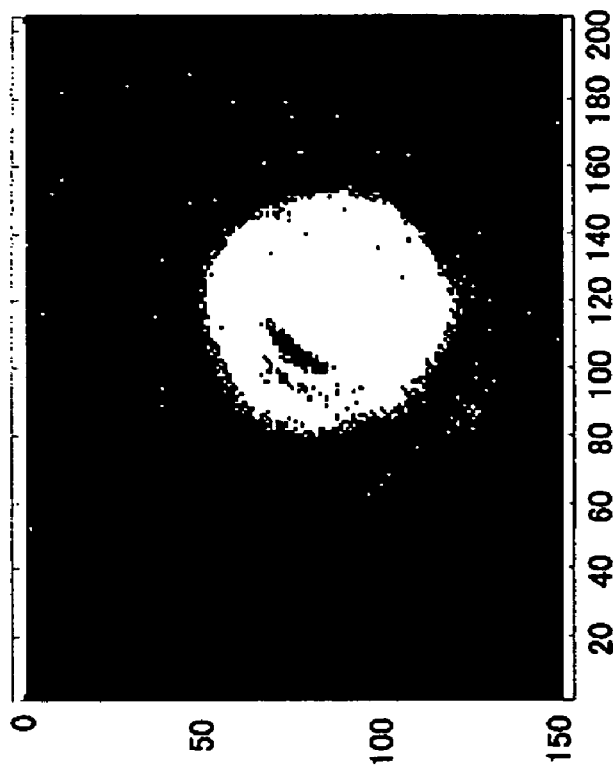
FIGS. 9A and 9B are views that compare the birefringent amount of the phase shifter and the polarization measurement's accuracy.
Figure 9A:
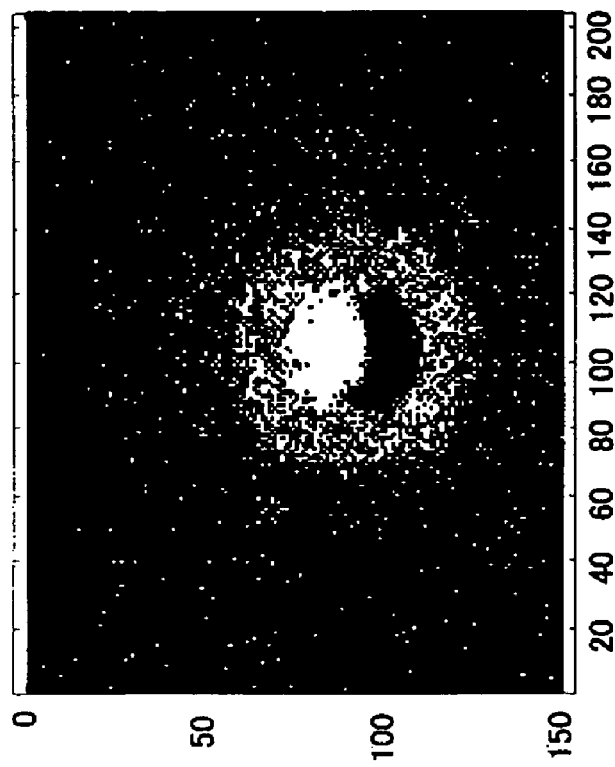

The polarization measurement accuracy by the phase shifter A will now be compared with that of the phase shifter B. FIGS. 9A and 9B are experimental results that compare the phase shifters A and B with each other, or the phase difference given by the phase shifter 110 with the polarization measurement accuracy. The same size of the light is used for the experiments in the phase shifters A and B.

FIG. 9A shows an experimental result using the phase shifter A, in which the second rotating angle is made at 57° in the third rotating method. FIG. 9B shows an experimental result using the phase shifter B, in which the second rotating angle is made at 57° in the third rotating method. In FIGS. 9A and 9B, black part means that the x component intensity is 0.5% or greater to the y component intensity in the measured polarized light, indicating low polarization measurement accuracy. On the other hand, white part means that the x component intensity is smaller than 0.5% to the y component intensity in the measured polarized light, indicating high polarization measurement accuracy. When FIGS. 9A and 9B are compared with each other, the phase shifter B has clearly more white parts and thus a higher accuracy than the phase shifter A. In the meantime, FIGS. 8B and 9B are measured in the same condition but exhibit different results, because the experimental conditions are different and the sizes of the lights are different.

Third Embodiment

A modification of the polarization element 16 will be described. Quartz is one glass material that transmits the light having a wavelength of 193 nm. An incident plane is defined as a plane that includes both incident light and reflected light that occurs when the incident light enters a quartz plane-parallel plate. Quartz has a refractive index of approximately 1.561 to the light having a wavelength of 193 nm, and a Brewster angle of approximately 57.3°.

When the quartz plane-parallel plate is inclined to the incident angle by the Brewster angle, almost 100% (intensity ratio) of a polarized light component parallel to the incident plane transmits and almost 68% (intensity ratio) of the polarized light component perpendicular to the incident plane transmits. Since the polarized light component parallel to the incident plane can improve the extinction ratio without attenuation, use of the Brewster window between the phase shifter 100 and the image pickup device 22 would provide a high extinction ratio and improve the polarization measurement accuracy.

Similarly, use of the PBS between the phase shifter 100 and the image pickup device 22 would provide a high extinction ratio, and improve the polarization measurement accuracy.

Figure 10:
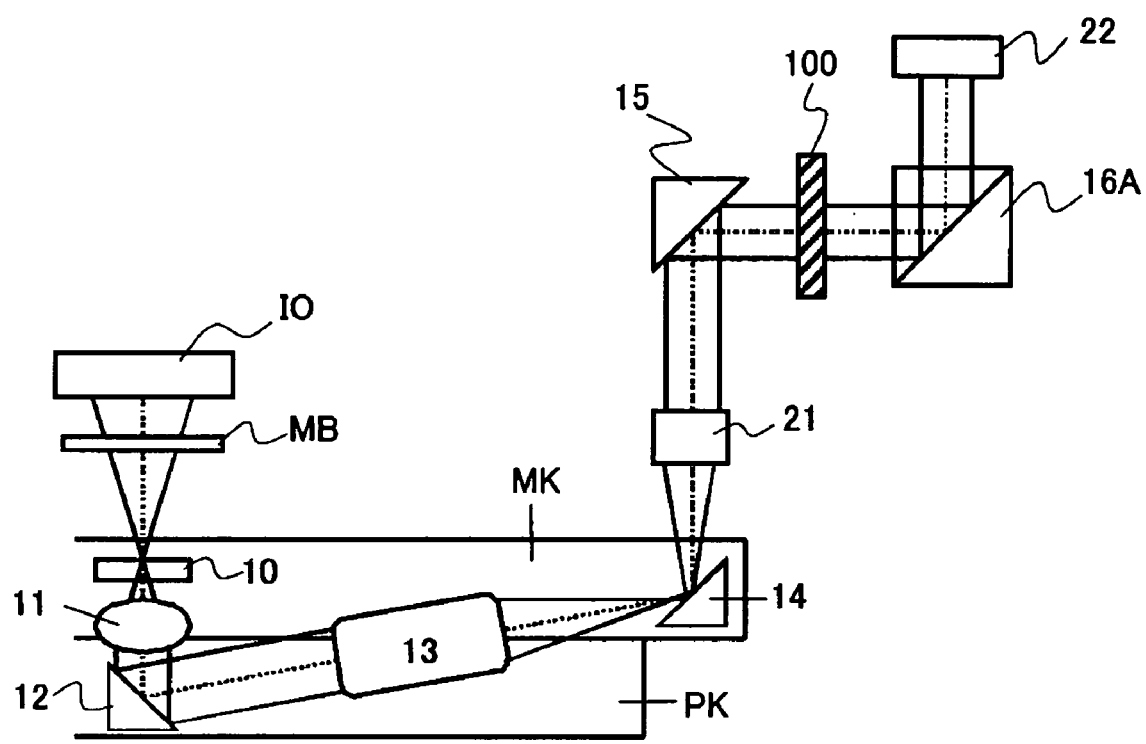
FIG. 10 is a schematic sectional view that shows a structure of a measuring apparatus that uses polarization beam splitter.

When the measuring apparatus 1 having a polarization measurement function is placed on the mask MK, the polarization element 16 may use the PBS 16A, as shown in FIG. 10, and the image pickup device 22 may measure the light reflected on the PBS 16A. It is understood from FIG. 10 that the polarization element 16 shown in FIG. 2 is replaced with the PBS 16A, which upwardly deflects the light that has transmitted the birefringent optical unit 100. However, the light deflecting direction is not limited to the upward direction, and any direction may be used, such as a downward direction, a lateral direction, and a front or back direction perpendicular to the paper plane. Of course, the transmitting light that has transmitted the PBS 16A may be used for the polarization measurement. Alternatively, the polarization measurement may use both the reflected light on the PBS 16A and the transmitting light that has transmitted the PBS 16A. FIG. 10 is a schematic sectional view of a structure of the measuring apparatus 1 that uses the polarization beam splitter.

In general, the light is incident upon the PBS 16A at an incident angle of 45°. However, when the incident angle of the light incident upon the PBS 16A is 45°, a sufficient extinction ratio cannot be usually obtained. For example, the extinction ratio of the polarization plate for the visible light is below 1%, whereas the extinction ratio of the PBS to the wavelength of 193 nm at the incident angle of 45° is about 25%. Use of the PBS 16A that sets the incident angle to the Brewster angle (such as 57°) would provide an extinction ratio of about 3%, and rapidly improve the polarization measurement accuracy.

Fourth Embodiment

An experiment is conducted by using the third rotating method to check the influence of different processing in the image pickup device 22 on the polarization measurement accuracy. This experiment uses a phase shifter that provides a phase difference of about 144°, and sets the second rotating angle to 57°. The incident light is a linearly polarized light inclined by −45° from the x-axis. A highly accurate polarization measurement is defined as a measurement in which a ratio is 0.5% or smaller between the intensity in the −45° direction and the intensity in the 45° direction.

The polarization measurement accuracy is studied in view of different processing in the image pickup device 22 as a CCD.

Figure 11B:
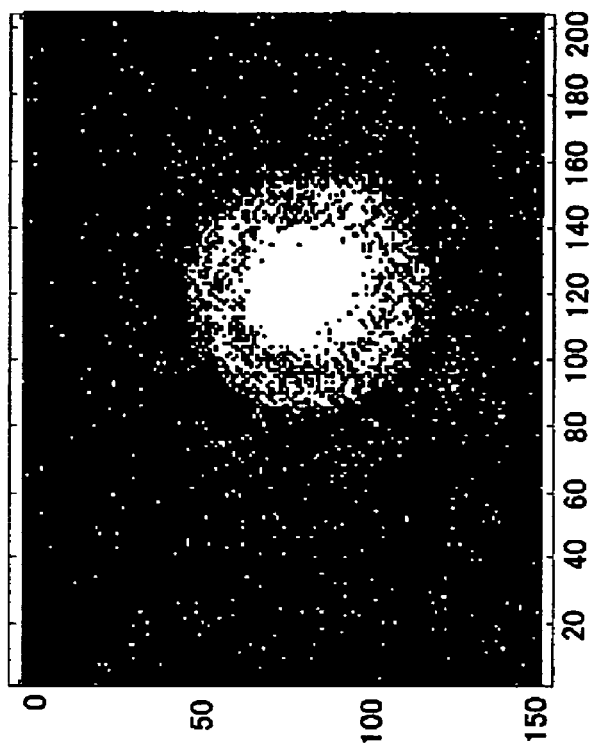
FIGS. 11A and 11B are views that compare the polarization measurements' accuracies due to different processing of an image pickup device.
Figure 11A:
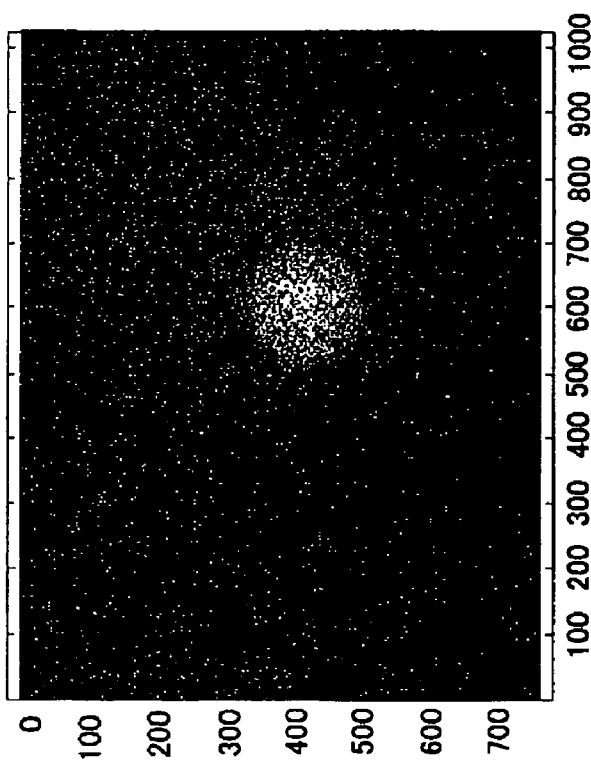

FIG. 11A is an experimental result when the polarization is measured at each pixel of the CCD. FIG. 11B shows a result of a polarization measurement experiment that averages the intensities of 5 pixels long by 5 pixels wide, i.e., totally 25 pixels on the CCD. In FIGS. 11A and 11B, black part means that the intensity ratio is 0.5% or greater, indicating low polarization measurement accuracy. On the other hand, white part means that the intensity ratio is smaller than 0.5%, indicating high polarization measurement accuracy. When FIGS. 11A and 11B are compared with each other, it is understood that the polarization measurement based on an averaged light intensity among the plural pixels of the CCD clearly has more white parts and thus a higher accuracy than that based on the light intensity of each pixel on the CCD.

Fifth Embodiment

The polarization measurement method that rotates the phase shifter three times can calculate the x-direction amplitude Ex, the y-direction amplitude Ey, and the phase difference δ. Since the image pickup device measures the light intensity, an equation of the square of the amplitude and the phase difference needs to be solved. A quadratic equation provides two solutions, and two polarization states are restored or measured when the polarization measurement method analyzes the measuring result. One of the two polarization states reflects the polarization state of the incident light, and the other is irrelevant.

By way of example, an experiment uses a polarization plate having x-direction and y-direction transmittances of the light intensity of 0.3% and 81.3%. This experiment uses the third rotating method and sets the second rotating angle to 57°. The birefringent amount of the phase shifter converted into the degree is approximately 144°. The light to be detected is the light having the amplitude Ex of 0.866, the amplitude Ey of 0.500, and the phase difference of −50°.

When the rotating angle is 0°, the observed light intensity is 0.165. When the rotating angles are 57° and 147°, the observation intensities are 0.422 and 0.657. The polarization state restored from these three kinds of intensity provides two polarization states. The first polarization state has the amplitude Ex of 0.866, the amplitude Ey of 0.500, and the phase difference of −50°. The second polarization state has the amplitude Ex of 1.202, the amplitude Ey of 0.500, and the phase difference of −150°.

The polarization measurement method that rotates the phase shifter three times results in a restoration of an irrelevant polarization state in addition to the proper state. A description will be given of a method of selecting a correct one of two polarization states. A first selecting means separately measures the incident light intensity, compares it with the intensity of the restored polarization state, and selects a closer one to the incident light intensity. In the above example, the incident light intensity is approximately 1. When the intensities of the two restored polarization states are studied, the first polarization state has an intensity of about 1, and the second polarization state has an intensity of about 1.7. In this case, the first polarization is a correct one closer to the incident light intensity.

The second selecting method uses the fourth rotating method. The fourth rotating method is vulnerable by a measurement error, and cannot distinguish the incident right-circularly polarized light from the incident left-polarized light. Thus, disadvantageously, a sign of the phase difference δ cannot be identified. Instead, this method can uniquely determine the incident light's amplitudes Ex and Ey. Use of this feature would provide a polarization measurement without an additionally measuring the incident light intensity.

For example, in the above polarization measuring system, the measured intensity is 0.409 when the rotating angle of the phase shifter is set to −57°. The polarization is restored by using the intensity of the rotating angle of 0°, the intensity of the rotating angle of 57°, and the intensity when the rotational angle of −57°. As a result, the amplitude Ex is 0.866, and the amplitude Ey is 0.500. When this result is compared with the result obtained from the third rotating method, the correct one is the first polarization state.

The third selecting method is introduced. When the observed intensity is analyzed by rotating the phase shifter four times, the Stokes parameters is uniquely obtained. The Stokes parameters are described by S0, S1, S2 and S3, and S0 denotes the incident light intensity. Therefore, use of So would measure the polarization state without an additional measurement of the incident light intensity. For example, the Stokes parameters are calculated by rotating the phase shifter by 0°, 57°, 147° and −57° in the above polarization measuring system. As a consequence, S0 is 1.00, S1 is 0.50, S2 is 0.56, and S3 is −0.66. Since So is 1.00, the incident light intensity is 1.00. When the result obtained from the third rotating method is compared, a correct one is the first polarization state. Alternatively, when the phase shifter is rotated four times, the square of Ex, the square of Ey, ExEycosδ are calculated as well as ExEysignδ. As a result, the polarization state can be measured uniquely.

Preferably, in measuring the Stokes parameters by rotating the phase shifter four times, one of the four rotating angles is 0° and a difference between any arbitrary two rotating angles is 90°. In other words, it is preferable that the four angles for rotating the phase shifter four times are 0, α1, α1+90, and α2.

Finally, the fourth selecting method will be discussed. This method is a method of rotating the phase shifter three times by changing a rotating angle. Then, additional two polarization states are obtained, and one of them is an answer. When two measurements are conducted each of which rotates the phase shifter three times (although the two measurements use different rotating angles of the phase shifter), two solutions have the same value among four solutions and are correct. Actual experiments are subject to a measurement error, an average of two close values among the four solutions may be regarded as an answer. The two measurements each of which rotates the phase shifter three times preferably use the third rotating method. A method of combining the third rotating method twice may set the second rotating angle, for example, to α1 for the first measurement time and to −α1+90° for the second measurement time, thereby eliminating an error of the phase shifter and improving the accuracy.

Thus, this embodiment has discussed a method of determining a correct answer when the third rotating method is used.

Sixth Embodiment

Figure 12:
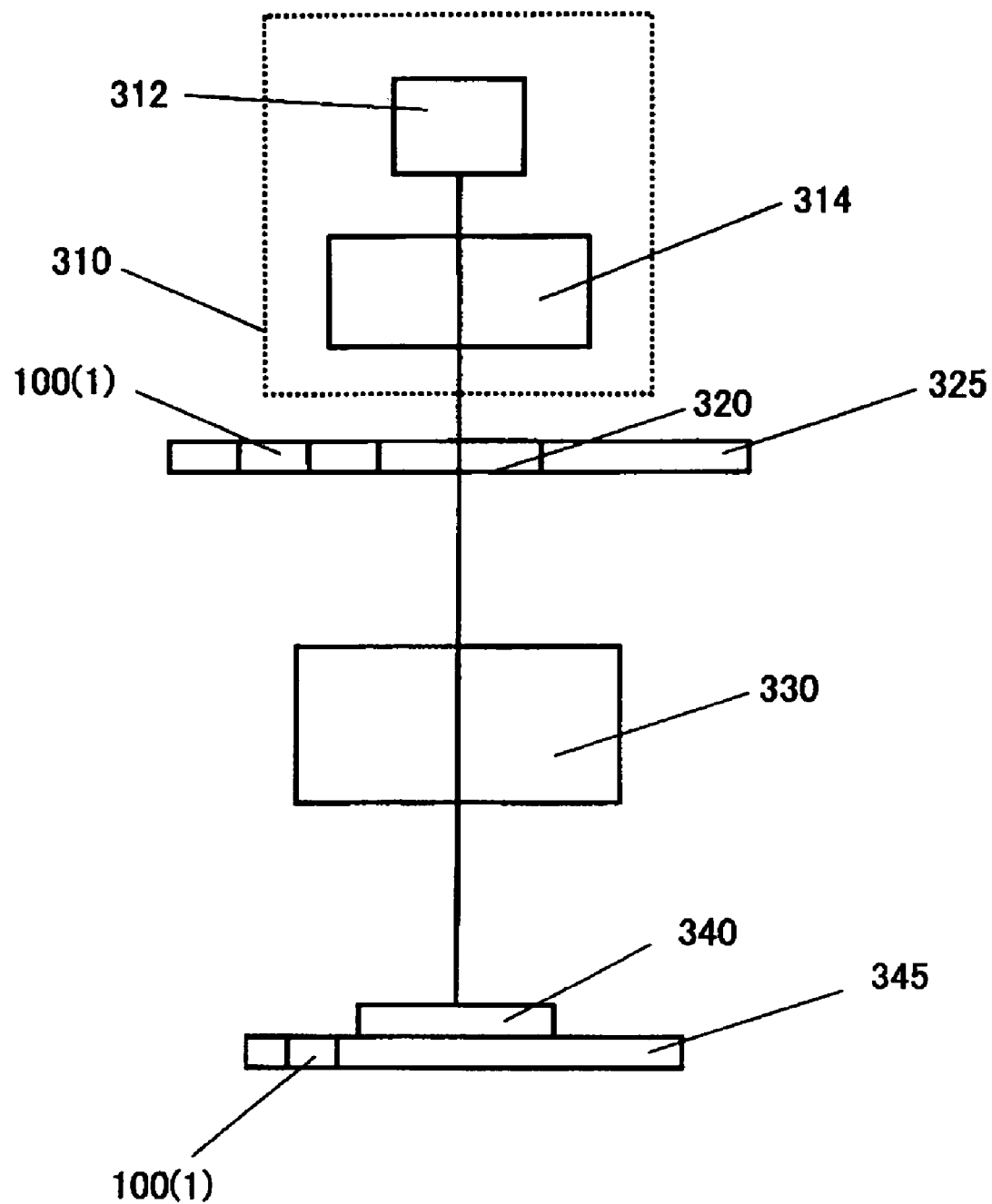
FIG. 12 is a schematic sectional view showing a structure of an exposure apparatus according to one aspect of the present invention.

Referring to FIG. 12, a description will be given of the inventive exposure apparatus 300 according to one aspect of the present invention. Here, FIG. 12 is a schematic sectional view of the inventive exposure apparatus 300. The exposure apparatus 300 is a projection exposure apparatus that exposes a circuit pattern of the reticle 320 onto the plate 340 in a step-and-scan manner. Of course, the exposure apparatus 300 is applicable to a step-and-repeat manner. Such an exposure apparatus is suitable for a sub-micron or quarter-micron lithography process, and this embodiment exemplarily describes a step-and-scan exposure apparatus (which is also called "a scanner"). The "step-and-scan manner," as used herein, is an exposure method that exposes a reticle pattern onto a wafer by continuously scanning the wafer relative to the reticle, and by moving, after a shot of exposure, the wafer stepwise to the next exposure area to be shot. The "step-and-repeat manner" is another mode of exposure method that moves a wafer stepwise to an exposure area for the next shot every shot of cell projection onto the wafer.

The exposure apparatus 300 includes, as shown in FIG. 12, an illumination apparatus 310 for illuminating the reticle 320, a reticle stage 325 for supporting the reticle 320, a projection optical system 330, and a stage 345 for supporting the plate 340.

The illumination apparatus 310 illuminates the reticle 320 that has a circuit pattern to be transferred, and includes a light source unit 312 and an illumination optical system 314.

The light source unit 312 uses as a light source, for example, an ArF excimer laser with a wavelength of approximately 193 nm, a KrF excimer laser with a wavelength of approximately 248 nm, and an $F_2$ laser with a wavelength of approximately 153 nm, etc. However, a type of laser is not limited to the excimer laser and the number of laser units is not limited. When the light source unit 312 uses laser, it is desirable to employ a beam shaping optical system that shapes a parallel beam from a laser source to a desired beam shape, and an incoherently turning optical system that turns a coherent laser beam into an incoherent one.

The illumination optical system 314 is an optical system that illuminates the reticle 320, and includes a lens, a mirror, an optical integrator, a stop, and the like, for example, a condenser lens, a fly-eye lens, an aperture stop, a condenser lens, a slit, and an imaging optical system in this order. The illumination optical system 314 can use any light whether it is axial or non-axial light. The optical integrator may include a fly-eye lens or an integrator formed by stacking two sets of cylindrical lens array plates (or lenticular lenses), and be replaced with an optical rod or a diffraction element.

The reticle 320 made, for example, of quartz, has a circuit pattern or an image to be transferred, and is supported and driven by the reticle stage 325. Diffracted light emitted from the reticle 320 passes the projection optical system 330, thus and then is projected onto the plate 340. The reticle 320 and the plate 340 are located in an optically conjugate relationship. Since the exposure apparatus 300 of this embodiment is a scanner, the reticle 320 and the plate 340 are scanned at a speed ratio of a reduction ratio, thus transferring the pattern on the reticle 320 to the plate 340. If it is a step-and-repeat exposure apparatus (referred to as a "stepper"), the reticle 320 and the plate 340 stand stationary during exposure.

The reticle stage 325 supports the reticle 320 via a reticle chuck (not shown) and is connected to a moving mechanism (not shown). The moving mechanism (not shown) includes a linear motor etc., drives the reticle stage 325 in XYZ directions and rotating directions or respective axes, and moves the reticle 320. The Y-axis is a scan direction on the plane of the reticle 320 or plate 340, and the X-axis is an orthogonal direction to the Y-axis. The Z-axis is a direction perpendicular to the plane of the retile 320 or the plate 340. An alignment scope (not shown) is provided near the reticle stage 325. When the exposure apparatus 300 measures the polarization state on the reticle plane, the measuring apparatus 1 is provided on the reticle stage 325 and measures the polarization state of the illumination light through a birefringent optical unit 100 (phase shifter 110), the polarization element 16, and image pickup device 22.

The projection optical system 330 may use a dioptric optical system solely including a plurality of lens elements, a catadioptric optical system including a plurality of lens elements and at least one concave mirror, an optical system including a plurality of lens elements and a full mirror type or catoptric optical system, etc. Any necessary correction of the chromatic aberration may use a plurality of lens units made from glass materials having different dispersion values (Abbe values).

The plate 340 is a target to be exposed such as a wafer and a liquid crystal plate, and photoresist is applied onto it.

The wafer stage 345 supports the plate 340 via a wafer chuck (not shown). Similar to the reticle stage 325, the stage 345 uses a linear motor to move the plate 340 in XYZ directions and rotating directions of respective axes. The positions of the wafer stage 345 and the reticle stage 325 are monitored, for example, by a laser interferometer and the like, so that both are driven at a constant speed ratio.

The wafer stage 345 is installed on a stage stool supported on the floor and the like, for example, via a damper, and the reticle stage 325 and the projection optical system 330 are installed on a barrel stool (not shown) supported, for example, via a damper to the base frame placed on the floor.

When the exposure apparatus 300 measures the polarization on the image plane, the above measuring apparatus 1 is provided onto the wafer stage 345. While the measuring apparatus 1 is independently provided onto the reticle stage 325 and the wafer stage 345 in this embodiment, the measuring apparatus 1 may be provided at only one of the stages, or at both of them separately.

In exposure, the light emitted from the light source unit 312, e.g., Koehler-illuminates the reticle 320 via the illumination optical system 314. The light that passes through the reticle 320 and reflects the reticle pattern is imaged on the plate 340 by the projection optical system 330. The exposure apparatus 300 has the measuring apparatus 1 on each of the reticle stage 325 and the wafer stage 345, and can accurately measure the polarization state of the illumination or exposure light in the UV area. When the measurement result is fed back to the illumination optical system to correct the polarization state, a desired polarization state can be formed reproducibly. The exposure apparatus 300 thereby provides high-quality devices (such as semiconductor devices, LCD devices, photographing devices (such as CCDs, etc.), thin film magnetic heads, and the like) than the conventional exposure.

Seventh Embodiment

Figure 13:
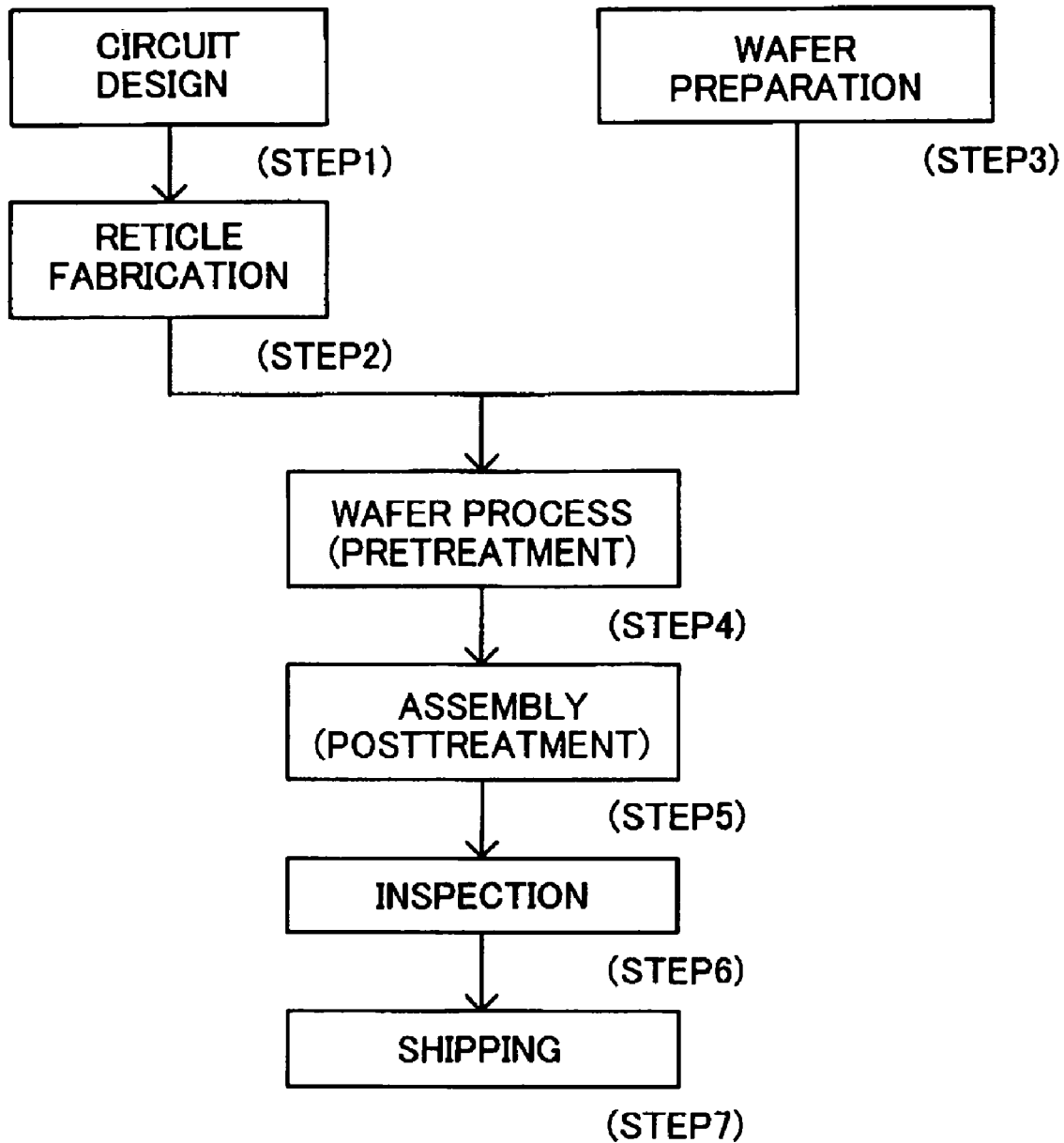
FIG. 13 is a flowchart for explaining manufacture of devices (such as semiconductor chips such as ICs and LCDs, CCDs, and the like).
Figure 14:
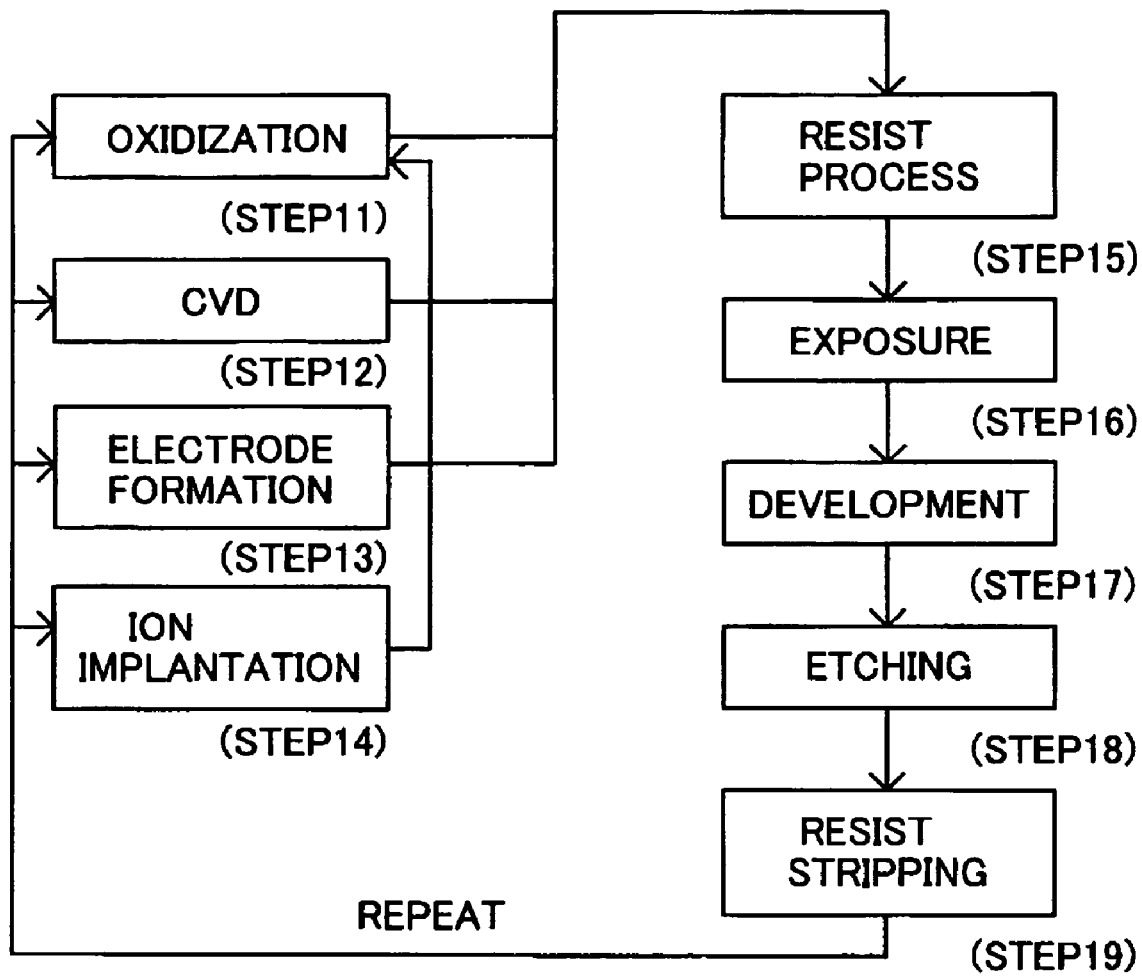
FIG. 14 is a detail flowchart of a wafer process as Step 4 shown in FIG. 13.

Referring now to FIGS. 13 and 14, a description will be given of an embodiment of a device manufacturing method using the above exposure apparatus 300. FIG. 13 is a flowchart for explaining how to fabricate devices (i.e., semiconductor chips such as IC and LSI, LCDs, CCDs, and the like). Here, a description will be given of the fabrication of a semiconductor chip as an example. Step 1 (circuit design) designs a semiconductor device circuit. Step 2 (reticle fabrication) forms a reticle having a designed circuit pattern. Step 3 (wafer preparation) manufactures a wafer using materials such as silicon. Step 4 (wafer process), which is also referred to as pretreatment, forms actual circuitry on the wafer through lithography using the reticle and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is fabricated and shipped (Step 7).

FIG. 14 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 300 to expose a circuit pattern on the reticle onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. Use of the device manufacturing method in this embodiment helps fabricate higher-quality devices than ever. The device manufacturing method that uses the exposure apparatus 300, and resultant devices constitute one aspect of the present invention.

Further, the present invention is not limited to these preferred embodiments, and various modifications and changes may be made in the present invention without departing from the spirit and scope thereof.

This application claims a foreign priority benefit based on Japanese Patent Applications Nos. 2005-057045, filed on Mar. 2, 2005, and 2005-355220, filed on Dec. 8, 2005, each of which is hereby incorporated by reference herein in its entirety as if fully set forth herein.

What is claimed is:

1. An exposure apparatus for exposing a pattern of a reticle onto a plate using light from a light source, said exposure apparatus comprising:

an illumination optical system for illuminating the reticle using the light from the light source;

a projection optical system for projecting the pattern of the reticle onto the plate; and a measuring unit for measuring three variables that consist of a pair of amplitudes of two orthogonal directions and a phase difference between the pair of amplitudes, and that are used to express a polarization state of the light from an object to be measured that is the illumination optical system or the projection optical system, the measuring unit being provided on an optical path of the light subsequent to the object to be measured and being not provided on the optical path between the light source and the object to be measured, the measuring unit including:

an optical unit for providing at least three phase difference to the light that has passed at least part of the object to be measured;

a polarization element for providing a different transmittance in accordance with the polarization state of the light that has passed the optical unit; and an image pickup device for detecting an intensity of the light that has passed the polarization element, wherein the optical unit includes a phase shifter and a rotating unit for rotating the phase shifter at least to a first rotating angle of $\theta°$, a second rotating angle of $(\theta+\alpha)°$, and a third rotating angle of $(\theta+\alpha+90)°$, where $\alpha°$ ranges between 32° and 39°, and the phase difference ranging between 130° and 150° when the optical unit is rotated to any one of the first, second, and third rotating angle.

2. An exposure apparatus according to claim 1, wherein the image pickup device detects intensity of light from an object to be measured, and wherein the polarization measuring unit measures the three variables based on the detecting result.

3. An exposure apparatus according to claim 1, wherein the rotating unit rotates the phase shifter to a fourth rotating angle of $\theta°$, a fifth rotating angle of $(\theta+\alpha')°$, and a sixth rotating angle of $(\theta+\alpha'90)°$, where $\alpha'°$ ranges between 32° and 39° and is different from $\alpha°$.

4. An exposure apparatus for exposing a pattern of a reticle onto a plate using light from a light source, said exposure apparatus comprising:

an illumination optical system for illuminating the reticle using the light from the light source;

a projection optical system for projecting the pattern of the reticle onto the plate; and a measuring unit for measuring three variables that consist of a pair of amplitudes of two orthogonal directions and a phase difference between the pair of amplitudes, and are used to express a polarization state of the light from an object to be measured that is the illumination optical system or the projection optical system, the measuring unit being provided on an optical path of the light subsequent to the object to be measured and being not provided on the optical path between the light source and the object to be measured, the measuring unit including:

an optical unit for providing at least three phase difference to the light that has passed at least part of the object to be measured;

a polarization element for providing a different transmittance in accordance with the polarization state of the light that has passed the optical unit; and an image pickup device for detecting an intensity of the light that has passed the polarization element, wherein the optical unit includes a photoelastic modulator and a stress applying part for applying to the photoelastic modulator at least a first stress to make a phase difference of 0° provided by the photoelastic modulator, a second stress to make a phase difference of $\phi°$ and a third stress to make a phase difference of $-\phi°$ while angle between a direction of a stress applied to the optical unit and a transmissive axis of the polarization element is between 32° and 39°.

5. An exposure apparatus according to claim 4, wherein the stress applying part applies to the photoelastic modulator a fourth stress to make a phase difference of 0° provided by the photoelastic modulator, a fifth stress to make a phase difference of $\phi'°$ and a sixth stress to make a phase difference of $-\phi'°$ wherein the amount of the phase difference $\phi'°$ is different from the amount of the phase difference $\phi°$.

* * * * *